(12) United States Patent
Konishi et al.

(10) Patent No.: US 9,613,849 B2
(45) Date of Patent: Apr. 4, 2017

(54) COMPOSITE SUBSTRATE MANUFACTURING METHOD, AND COMPOSITE SUBSTRATE

(71) Applicant: Shin-Etsu Chemical Co., Ltd., Tokyo (JP)

(72) Inventors: Shigeru Konishi, Annaka (JP); Shozo Shirai, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/440,620

(22) PCT Filed: Nov. 19, 2013

(86) PCT No.: PCT/JP2013/081091
§ 371 (c)(1),
(2) Date: May 5, 2015

(87) PCT Pub. No.: WO2014/080874
PCT Pub. Date: May 30, 2014

(65) Prior Publication Data
US 2015/0303097 A1    Oct. 22, 2015

(30) Foreign Application Priority Data
Nov. 22, 2012   (JP) .................................. 2012-255865

(51) Int. Cl.
*H01L 21/46*    (2006.01)
*H01L 21/762*    (2006.01)
(Continued)

(52) U.S. Cl.
CPC .. *H01L 21/76254* (2013.01); *H01L 21/02164* (2013.01); *H01L 21/02222* (2013.01);
(Continued)

(58) Field of Classification Search
CPC ......... H01L 21/02164; H01L 21/02222; H01L 21/02282; H01L 21/02326; H01L 21/265; H01L 21/316
(Continued)

(56) References Cited

U.S. PATENT DOCUMENTS 5,665,643 A * 9/1997 Shin ...................... H01L 21/312
                                                                257/E21.259
7,785,948 B2   8/2010 Kamata et al.
(Continued)

FOREIGN PATENT DOCUMENTS

CN      101366103 A      2/2009
CN      102024742 A      4/2011
(Continued)

OTHER PUBLICATIONS

International Search Report dated Feb. 18, 2014, issued in corresponding application No. PCT/JP2013/081091.
(Continued)

*Primary Examiner* — Trung Q Dang
(74) *Attorney, Agent, or Firm* — Westerman, Hattori, Daniels & Adrian, LLP

(57) ABSTRACT

Disclosed is a composite substrate manufacturing method whereby, after bonding a semiconductor substrate (1) and a supporting substrate (3) to each other, the semiconductor substrate (1) is thinned, and a composite substrate (8) having a semiconductor layer (6) on the supporting substrate (3) is obtained. On the supporting substrate (3) surface to be bonded, a coating film (4a) containing polysilazane is formed, a silicon-containing insulating film (4) is formed by performing firing by heating the coating film (4a) to 600-1,200° C., then, the semiconductor substrate (1) and the supporting substrate (3) are bonded to each other with the insulating film (4) therebetween, thereby suppressing bonding failures due to surface roughness and defects of the supporting substrate, and easily obtaining the composite substrate.

9 Claims, 4 Drawing Sheets

BONDING

SEPARATION TREATMENT

(51) Int. Cl.
*H01L 21/02* (2006.01)
*H01L 21/265* (2006.01)
*H01L 21/302* (2006.01)
*H01L 21/683* (2006.01)
*H01L 29/06* (2006.01)

(52) U.S. Cl.
CPC .. *H01L 21/02282* (2013.01); *H01L 21/02326* (2013.01); *H01L 21/02329* (2013.01); *H01L 21/02337* (2013.01); *H01L 21/265* (2013.01); *H01L 21/302* (2013.01); *H01L 21/6835* (2013.01); *H01L 29/0649* (2013.01); *H01L 2221/68327* (2013.01)

(58) Field of Classification Search
USPC ........................................................ 438/459
See application file for complete search history.

(56) References Cited

U.S. PATENT DOCUMENTS

| | | | | |
|---|---|---|---|---|
| 2004/0072429 | A1* | 4/2004 | Hieda | H01L 21/02164 438/689 |
| 2005/0017633 | A1* | 1/2005 | Miyadera | H05B 33/04 313/512 |
| 2007/0231484 | A1 | 10/2007 | Hishiya et al. | |
| 2009/0278223 | A1 | 11/2009 | Ishikawa et al. | |
| 2009/0305459 | A1* | 12/2009 | Bhattacharya | H01L 31/02966 438/102 |
| 2011/0065288 | A1 | 3/2011 | Harada et al. | |
| 2012/0132890 | A1* | 5/2012 | Song | H01L 33/06 257/13 |

FOREIGN PATENT DOCUMENTS

| | | |
|---|---|---|
| JP | 10-194873 A | 7/1998 |
| JP | 2005-45230 A | 2/2005 |
| JP | 2005-116706 A | 4/2005 |
| JP | 2006-295037 A | 10/2006 |
| JP | 4728030 B2 | 7/2011 |
| WO | 2006/019157 A1 | 2/2006 |

OTHER PUBLICATIONS

Moutanabbir et al., "Bulk GaN Ion Cleaving", Journal of Electronic Materials, Feb. 24, 2010, pp. 482-488, vol. 39, No. 5, cited in the Specification.
Office Action dated Oct. 17, 2016, issued in counterpart Chinese Application No. 201380061023.7 (6 pages).

\* cited by examiner

\* PEAK ASSIGNED TO Si SUBSTRATE

COMPOSITE SUBSTRATE MANUFACTURING METHOD, AND COMPOSITE SUBSTRATE

TECHNICAL FIELD

This invention relates to a method for preparing a composite substrate by the step of bonding a semiconductor substrate to a support substrate via an insulating film, and a composite substrate obtained by the method.

BACKGROUND ART

Studies are made to apply Group III-V semiconductors such as GaN and wide-gap semiconductors such as SiC to light-emitting elements, high-breakdown-voltage devices and RF devices by utilizing their own physical properties. Defects in these semiconductor materials become a problem to be overcome prior to practical implementation. For the purpose of reducing defects in a material, use of single-crystal bulk materials is more advantageous than the heteroepitaxial growth of thin film as long as the number of defects is concerned. However, these single-crystal materials are expensive. The preparation method via ion implantation/separation is employed in the manufacture of silicon-on-insulator (SOI) or silicon-on-sapphire (SOS), for example, the method involving the steps of joining and bonding a silicon wafer (Si wafer) having hydrogen or rare gas ions implanted therein to a support substrate such as silicon wafer or sapphire wafer, heat treating the bonded substrate to cause embrittlement of the ion-implanted region in the Si wafer, separating the Si wafer at the ion-implanted region by thermal or mechanical means, for thereby transferring a Si thin film to the support substrate. With this method, a cost reduction is expectable from reuse of the wafer after transfer.

No problems arise in the bonding of SOI and SOS because the silicon wafer and sapphire wafer have a smooth surface. However, in the case of GaN wafer and SiC wafer, for example, it is very difficult to smoothen their surface to the bondable level or such smoothening needs a cost. As in the case of bonding of GaN wafer or SiC wafer, when a polycrystalline material or a suitable substrate having a polycrystalline material deposited on its surface is bonded to a substrate of different species, direct bonding is impossible because the polycrystalline material has a substantially irregular surface.

In order that a material substrate having a non-smooth or irregular surface be used in the bonding step, a study is made to deposit an amorphous material such as $SiO_2$ or amorphous Si on the substrate surface, and to smoothen the deposited surface by chemical-mechanical polishing (CMP) or otherwise polishing to a level viable to direct bonding. See Non-Patent Document 1: O. Mountanabbir et al., Journal of Electronic Materials 39 (5), 482-488 (2010). For the deposition of $SiO_2$ or amorphous Si, vapor phase growth methods such as plasma-enhanced chemical vapor deposition (PECVD) and low pressure chemical vapor deposition (LP-CVD) are generally used. However, these methods suffer from problems of an expensive equipment and cost needed for deposition. Since the film thus deposited has a substantial surface roughness, polishing treatment must be carried out prior to the bonding step. Extra steps cause another problem to the process.

As the means for depositing a film in an inexpensive manner, it is contemplated to form a spin-on-glass (SOG) layer on a rough or irregular surface. Examples of the spin-on-glass include boron phosphorus silicon glass (BPSG) and water glass. Since the SOG material contains impurities such as B, P and Na, it is difficult to use the material as a joint layer in electronic device applications using SOI, SOS, SiC, GaN or the like.

One candidate for an impurity-free SOG layer is obtained by coating a polysilazane solution and effecting heat treatment (or firing treatment) to convert the polysilazane to $SiO_2$. Since the film resulting from conversion of polysilazane to $SiO_2$ contains less impurities and is effective in burying an irregular pattern, studies are made to apply the film to the interlayer insulating film of devices (Patent Document 1: JP-A 2005-45230) or the gate insulating layer of organic TFT (Patent Document 2: WO 2006/019157). In these applications, however, a $SiO_2$ film is formed at a low temperature of about 450° C. at maximum. When the film is used as the joint layer in electronic devices, the influence of components other than $SiO_2$ and functional groups in the film becomes of concern.

Typical of the use of fired polysilazane film for bonding of substrates is an example obtained by slit coating an irregular pattern surface with polysilazane, firing the polysilazane into $SiO_2$ and bonding it to an Si wafer (Patent Document 3: JP 4728030). In this example, the bonding process is carried out by using a substrate having steps with a height of 500 nm, slit coating the substrate with polysilazane, heating at 350° C. for conversion to $SiO_2$, smoothening by CMP, bonding to a Si substrate having hydrogen ions implanted therein, separating the Si substrate at the ion-implanted region, and transferring a Si thin film, thus yielding a desired wafer structure. That is, polishing treatment for smoothening is essential.

As discussed above, the formation of amorphous material by CVD technique is one known example of the means for providing a smooth bonding layer on a substrate surface having a considerable roughness, but suffers from the problem of cost because an expensive equipment is necessary for film deposition, and polishing must be carried out for smoothening after the film deposition. Few studies have been made on simple means other than the CVD technique, for example, the use of SOG as the joint surface for a semiconductor device layer. With respect to the use of polysilazane as SOG, most studies are directed to the low-temperature conversion to $SiO_2$ whereas few studies are directed to the application to the joint surface becoming a buried oxide layer of SOI. Furthermore, with respect to the means for eliminating steps on the bonding surface, an example of coating polysilazane and converting to $SiO_2$ is known. However, since bonding follows polishing, it has not been studied whether or not a $SiO_2$ film reduces the roughness of a bonding surface to enable bonding without a need for polishing, and whether or not the resulting $SiO_2$ film is at a film quality level ready for use at the electronic device joint surface as the insulating film.

CITATION LIST

Patent Documents

Patent Document 1: JP-A 2005-45230
Patent Document 2: WO 2006/019157
Patent Document 3: JP 4728030

Non-Patent Document

Non-Patent Document 1: O. Mountanabbir et al., Journal of Electronic Materials 39 (5), 482-488 (2010)

SUMMARY OF INVENTION

Technical Problem

An object of the invention, which has been made under the above-mentioned circumstances, is to provide a method for preparing a composite substrate in a simple manner while minimizing bonding failures due to surface roughness and defects of a support substrate, and a composite substrate.

Solution to Problem

Making intensive efforts to attain the above object, the inventors have found that by forming a polysilazane-containing coating and effecting firing treatment in an oxygen-containing atmosphere at a heating temperature of 600° C. to 1,200° C., there is obtained a $SiO_2$ insulating film (SOG) having a substantially equivalent dielectric strength to the thermally oxidized silicon film. It has also been found that since the $SiO_2$ film resulting from polysilazane is improved in smoothening capability such as step coverage, the use of $SiO_2$ film which has been converted at the above temperature enables bonding at the thickness as of firing treatment without a need for surface polishing, that is, bonding is possible in a simple way as compared with the CVD technique, at a high level of insulation, and without a need for polishing. It has also been found that a SiN insulating film can be formed when the atmosphere of firing treatment is a nitrogen-containing inert atmosphere or vacuum, and in this case too, the insulating film can be bonded at the thickness as of firing treatment without a need for polishing. The invention is predicated on these findings and ensuing investigations.

Accordingly, the invention provides a method for preparing a composite substrate and a composite substrate, as defined below.

[1] A method for preparing a composite substrate, comprising the steps of bonding a semiconductor substrate to a support substrate, and thinning the semiconductor substrate for thereby yielding a composite substrate having a semiconductor layer on the support substrate, characterized in that
a polysilazane-containing coating is formed on either one of the surfaces of the semiconductor substrate and the support substrate to be bonded, the coating is subjected to firing treatment of heating at 600° C. to 1,200° C. to form a silicon-containing insulating film, and thereafter, the semiconductor substrate is bonded to the support substrate via the insulating film.

[2] The method for preparing a composite substrate of [1] wherein the polysilazane is a perhydropolysilazane.

[3] The method for preparing a composite substrate of [1] or [2] wherein the firing treatment is carried out in an atmosphere containing oxygen and/or steam.

[4] The method for preparing a composite substrate of [1] or [2] wherein the firing treatment is carried out in an inert atmosphere containing nitrogen or under reduced pressure.

[5] The method for preparing a composite substrate of any one of [1] to [4] wherein the semiconductor substrate and the support substrate are bonded while keeping the thickness of the insulating film as of the firing treatment.

[6] The method for preparing a composite substrate of any one of [1] to [5], the method comprising the steps of implanting ions into the surface of the semiconductor substrate to form an ion-implanted region, forming the silicon-containing insulating film on the surface of the support substrate to be bonded, bonding the ion-implanted surface of the semiconductor substrate to the surface of the support substrate via the insulating film, and separating the semiconductor substrate at the ion-implanted region, thus leaving a semiconductor layer on the support substrate.

[7] A composite substrate obtained by the method of any one of [1] to [6].

Advantageous Effects of Invention

According to the invention, once a polysilazane-containing coating is formed, an insulating film having good insulating properties and amenable to bonding can be formed in a simple manner, and a composite substrate wherein the insulating film and a semiconductor layer are stacked on a support substrate can be produced which is suitable in electronic device application. Even when a substrate has a rough surface, the insulating film is effective for reducing the roughness of the surface. The insulating film can be bonded at the thickness as of firing treatment without a need for polishing or otherwise treating.

DESCRIPTION OF EMBODIMENTS

Figure 1:
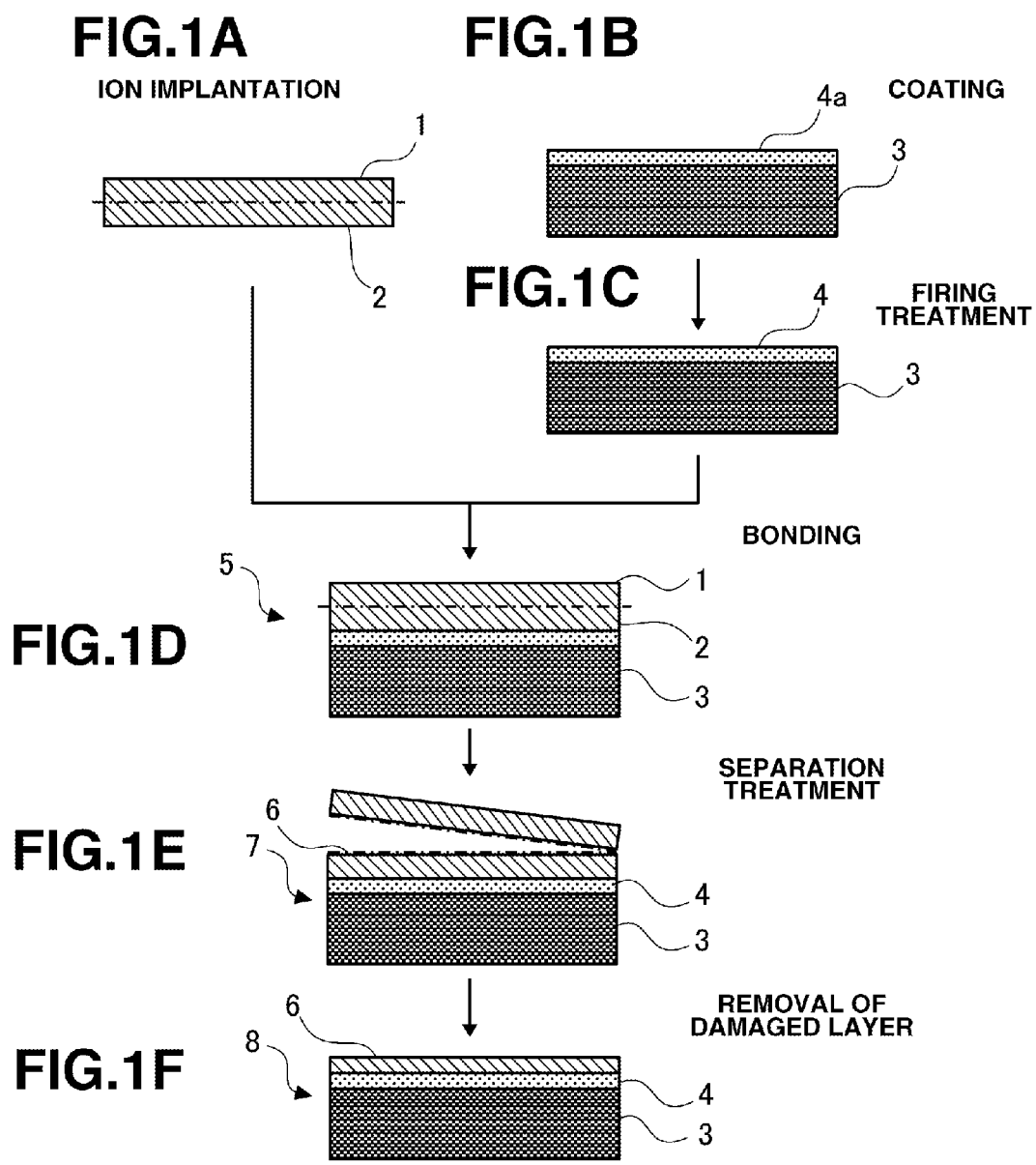
FIG. 1 is a schematic view showing steps of the method for preparing a composite substrate according to one embodiment of the invention; (a) being a cross-sectional view of an ion-implanted semiconductor substrate; (b) being a cross-sectional view of a support substrate having a perhydropolysilazane-containing coating; (c) being a cross-sectional view of the support substrate on which an insulating film has been formed by firing treatment; (d) being a cross-sectional view of a bonded structure of semiconductor substrate/support substrate; (e) being a cross-sectional view of the structure from which the semiconductor substrate is separated along the ion-implanted region; (f) being a cross-sectional view of a composite substrate.

The method for preparing a composite substrate according to the invention is described in conjunction with FIG. 1 by referring to the production of an SOI substrate as a typical example, although the invention is not limited thereto.

The method for preparing a composite substrate according to the invention involves, as shown in FIG. 1, the following successive steps: step 1 of implanting hydrogen ions (rare gas ions) into a semiconductor substrate, step 2 of forming an insulating film, step 3 of surface activating the semiconductor substrate and/or support substrate, step 4 of bonding the semiconductor substrate to the support substrate, step 5 of separating treatment, and step 6 of removing a damaged layer.

(Step 1 of Implanting Hydrogen Ions (Rare Gas Ions) into Semiconductor Substrate)

First, hydrogen ions or rare gas (i.e., helium, neon, argon, krypton, xenon or radon) ions are implanted into a semiconductor substrate 1 from its surface to form an ion-implanted region 2 in the substrate (FIG. 1 (a)).

Although the embodiment illustrated herein uses a silicon substrate as the substrate (semiconductor substrate) from which a semiconductor layer is to be formed by transfer, the invention is not limited thereto. A substrate composed of any material selected from the group consisting of silicon-germanium (SiGe), silicon carbide (SiC), aluminum nitride (AlN), germanium (Ge), gallium nitride (GaN), zinc oxide (ZnO), and gallium arsenide (GaAs) may be used as the semiconductor substrate. Alternatively, a substrate having a single crystal semiconductor layer at the bonding surface, typically SOI substrate may also be used.

The single crystal silicon substrate (also referred to as silicon substrate, hereinafter) used as the semiconductor substrate 1 may be, for example, a substrate obtained by slicing a single crystal ingot grown by the Czochralski (CZ) method and typically having a diameter of 100 to 300 mm, a conductivity type: P or N type, and a resistivity of about 10 Ω·cm, but not limited thereto.

The method of forming the ion-implanted region 2 is not particularly limited. For example, a predetermined dose of hydrogen ions or rare gas ions are implanted with an implantation energy sufficient to form the ion-implanted region 2 at the desired depth from the surface of semiconductor substrate 1. Implantation conditions include, for example, an implantation energy of 50 to 100 keV and an implantation dose of $2\times10^{16}$ to $5\times10^{17}/cm^2$. Hydrogen ions to be implanted are preferably hydrogen ions ($H^+$) in a dose of $2\times10^{16}$ to $5\times10^{17}$ atoms/$cm^2$ or hydrogen molecule ions ($H_2^+$) in a dose of $1\times10^{16}$ to $2.5\times10^{17}$ atoms/$cm^2$. Most preferred are hydrogen ions ($H^+$) in a dose of $6\times10^{16}$ to $3\times10^{17}$ atoms/$cm^2$ or hydrogen molecule ions ($H_2^+$) in a dose of $3\times10^{16}$ to $1.5\times10^{17}$ atoms/$cm^2$.

While the depth from the substrate surface subject to ion implantation to the ion-implanted region 2 (that is, depth of ion implantation) corresponds to the desired thickness of a semiconductor layer (silicon thin film) to be formed on the support substrate 3, the depth of ion implantation is preferably 300 to 500 nm, more preferably about 400 nm. The thickness of ion-implanted region 2 (that is, ion distribution thickness) may be sufficient to facilitate separation or exfoliation by mechanical impacts or other means, and is preferably 200 to 400 nm, more preferably about 300 nm.

(Step 2 of Forming Insulating Film)

Next, a silicon-containing insulating film 4 is formed on either one or both of the surfaces of semiconductor substrate 1 and support substrate 3 to be bonded together. Reference is now made to the embodiment wherein the insulating film 4 is formed on the surface of support substrate 3 to be bonded (FIG. 1 (b), (c)).

First, a coating 4a containing polysilazane is formed on the support substrate 3 (FIG. 1 (b)).

The support substrate 3 used herein may be any substrate selected from single crystal substrates of silicon, sapphire, SiC, GaAs, GaN, and ZnO, amorphous substrates of synthetic quartz and multicomponent glass, and polycrystalline substrates of p-Si, SiC, $Si_3N_4$, $Al_2O_3$, and AlN.

A coating composition used to form the polysilazane-containing coating 4a is a composition comprising polysilazane and a solvent.

The polysilazane is preferably perhydropolysilazane having the general formula: —$(SiH_2NH)_n$— because the insulating film following conversion contains less residual impurities. Notably, the perhydropolysilazane is an inorganic polymer comprising base units: —$(SiH_2NH)$—, with all side chains being hydrogen, which is soluble in organic solvents.

The solvent may be any of solvents which are non-reactive when mixed with perhydropolysilazane. Use may be made of aromatic solvents, aliphatic solvents, and ether solvents such as toluene, xylene, dibutyl ether, diethyl ether, tetrahydrofuran (THF), propylene glycol methoxy ether (PGME), propylene glycol monomethyl ether acetate (PG-MEA), and hexane.

The polysilazane is preferably present in the solvent in a concentration of 1 to 30% by weight, more preferably 3 to 20% by weight. A solution with a concentration of less than 1 wt % may form a film after coating, which is too thin to exert the effect of improving the surface roughness of support substrate 3 to a full extent whereas a solution with a concentration of more than 30 wt % may lose stability.

The means for coating the coating composition may be any of well-known means including spray coating, spin coating, dip coating, roll coating, screen printing, and slit coating. The coating thickness is determined by the roughness and step height on the substrate surface to be coated, and the thickness of buried layer required as the semiconductor device. Preferably the coating thickness is such that the insulating film 4 after firing may have a thickness of 10 nm to 10 µm. If the desired coating thickness is not reached by a single coating step, the coating step may be repeated to form multiple layers.

For removal of the solvent, the coating step is followed by drying at about 50 to 200° C. for 1 minute to 2 hours to form a film 4a.

Next, the film 4a is subjected to firing treatment by heating at a temperature of from 600° C. to 1,200° C. to convert the polysilazane in the film 4a to $SiO_2$ or SiN, yielding an insulating film 4 (FIG. 1 (c)).

When polysilazane is converted to $SiO_2$, the firing treatment is carried out by heating in an atmosphere containing oxygen and/or steam at a temperature of 600° C. to 1,200° C., preferably 800° C. to 1,000° C. At a heating temperature of lower than 600° C., for example, at 450° C., the polysilazane skeleton is converted to a siloxane skeleton, but silanol groups are left, which lead to higher leakage current in a dielectric strength test than the thermally oxidized silicon. Albeit the tendency that the surface roughness of insulating film 4 is improved as the heating temperature becomes higher, $SiO_2$ can be decomposed above 1,200° C.

When polysilazane is converted to SiN, the firing treatment is carried out by heating in an inert atmosphere containing nitrogen or in reduced pressure vacuum at a temperature of 600° C. to 1,200° C., preferably in reduced pressure vacuum at a temperature of 800° C. to 1,000° C. At a heating temperature of lower than 600° C., conversion to SiN does not take place. Albeit the tendency that the surface roughness of insulating film 4 is improved as the heating temperature becomes higher, SiN can be decomposed above 1,200° C.

The time of firing treatment is preferably 10 seconds to 12 hours, more preferably 1 minute to 1 hour. A treatment time of less than 10 seconds may result in insufficient conversion from polysilazane whereas a time of more than 12 hours may add to the cost of firing treatment.

By the firing treatment described above, the insulating film 4 is formed on the surface of support substrate 3 to be bonded (FIG. 1 (c)).

The insulating film 4 preferably has a thickness of 10 nm to 10 µm, more preferably 20 nm to 5 µm. A thickness of less than 10 nm may fail to fully exert the effect of improving the surface roughness of support substrate 3 whereas a thickness of more than 10 µm may be inadequate as the buried layer in semiconductor devices.

The insulating film 4 has a substantially equivalent dielectric strength to the conventional thermally oxidized silicon film. Also the insulating film 4 presents a sufficiently smooth surface to enable bonding at the thickness as of firing treatment, that is, without a need for polishing the surface of insulating film 4. Particularly, even when the support substrate 3 is a GaN wafer, SiC wafer or polycrystalline material and has a rough surface which is unamenable to subsequent bonding without further treatment, the provision of insulating film 4 thereon improves the surface roughness to provide a sufficiently smooth surface to enable bonding at the thickness as of firing treatment without a need for polishing the surface of insulating film 4. The insulating film 4 with the thickness as of firing treatment means omission of any treatment which causes changes to the surface roughness such as polishing or etching while the surface activation treatment to be described later is permissible.

Herein, the insulating film 4 with the thickness as of firing treatment preferably has a surface roughness Rms of up to 1.0 nm, more preferably up to 0.8 nm. A film with a surface roughness Rms in excess of 1.0 nm may not be bonded to the semiconductor substrate 1.

It is noted that Rms (root-mean-square) is a root-mean-square roughness determined as the square root of the mean of square values of deviations relative to the arithmetic mean of cross-sectional profile per reference length, that is, root-mean-square roughness Rq as prescribed in JIS B0601:2013.

(Step 3 of Surface Activation of Semiconductor Substrate and/or Support Substrate)

Prior to the bonding step, one or both of the surface of semiconductor substrate 1 subject to ion implantation and the surface of insulating film 4 on support substrate 3 are subjected to surface activation treatment.

The surface activation treatment intends to activate the substrate surface by exposing highly reactive dangling bonds on the substrate surface or by imparting OH groups to the dangling bonds. This may be achieved, for example, by plasma treatment or ion beam irradiation.

In the case of plasma treatment, for example, the semiconductor substrate 1 and/or support substrate 3 is placed in a vacuum chamber, a plasma-creating gas is introduced therein, and the substrate is exposed to a high-frequency plasma of about 100 W for about 5 to 10 seconds, whereby the surface is plasma treated. For the treatment of semiconductor substrate 1, the plasma-creating gas may be a plasma of oxygen gas when the surface is oxidized, or hydrogen gas, argon gas, a mixture of hydrogen gas and argon gas, or a mixture of hydrogen gas and helium gas, when the surface is not oxidized. For the treatment of the insulating film 4 on support substrate 3, the plasma-creating gas may be hydrogen gas, argon gas, a mixture of hydrogen gas and argon gas, or a mixture of hydrogen gas and helium gas. Through the treatment, any organic matter on the surface of semiconductor substrate 1 is oxidized and removed and more OH groups are available on the surface, that is, the surface is activated. Also, the surface of insulating film 4 on support substrate 3 is activated as a result of impurities being removed therefrom.

In the treatment by ion beam irradiation, ion beams of the gas used in the plasma treatment are irradiated to the semiconductor substrate 1 and/or the insulating film 4 on support substrate 3 for sputtering its surface, for thereby exposing dangling bonds on the surface to increase the bonding force.

(Step 4 of Bonding Semiconductor Substrate and Support Substrate Together)

Next, the surface of semiconductor substrate 1 subject to ion implantation and the surface of insulating film 4 on support substrate 3 are bonded together (FIG. 1 (d)). The substrates may be bonded together while heating at about 150 to 200° C. The joined assembly is referred to as bonded substrate 5, hereinafter. If at least one of the surface of semiconductor substrate 1 subject to ion implantation and the surface of insulating film 4 has been activated, a tighter bond is established.

After the bonding step, the bonded substrate 5 is heat treated (second heat treatment) by applying heat. The second heat treatment reinforces the bond between semiconductor substrate 1 and support substrate 3 via the insulating film 4. For the second heat treatment, a temperature at which the bonded substrate 5 is not ruptured by the impact (i.e., thermal stress) of the difference in coefficient of thermal expansion between semiconductor substrate 1 and support substrate 3 is selected. The heat treatment temperature is preferably up to 300° C., more preferably 150 to 250° C., and even more preferably 150 to 200° C. The heat treatment time is typically 1 to 24 hours.

(Step 5 of Separation)

Next, thermal, mechanical or optical energy is applied to the ion-implanted region in bonded substrate 5 to induce separation along the ion-implanted region 2. A portion of semiconductor substrate 1 is thus transferred as a semiconductor layer 6 to the support substrate 3, yielding a wafer 7 (FIG. 1 (e)). That is, a semiconductor thin film bonded to support substrate 3 via insulating film 4 is separated from the semiconductor substrate 1 and used as a semiconductor layer (silicon layer) 6. The separation is preferably by the progress of cleavage along the ion-implanted region 2 from one end to the opposite end of bonded substrate 5.

The separation treatment may be carried out by one technique or combination of two or more techniques selected from a variety of techniques, for example, a separation technique of heating the ion-implanted region at a temperature of preferably at least 200° C., more preferably 250 to 350° C. to apply thermal energy to the region to generate microscopic bubbles therein; a separation technique (utilizing the ion-implanted region which has been embrittled by the heat treatment) of applying mechanical energy, typically applying impact force by injecting a jet of a fluid such as gas or liquid to the embrittled region while selecting a pressure in the range of 1 MPa to 5 MPa so as not to cause wafer rupture; a separation technique (utilizing the ion-implanted region which has been made amorphous) of irradiating light of wavelength absorbed by amorphous material to the ion-implanted region, and allowing the region to absorb optical energy to induce separation along the ion-implanted interface.

(Step 6 of Removing Ion-Implantation-Affected Layer)

Next, a layer which contains crystal defects as a result of being damaged by ion implantation is removed from the surface of semiconductor layer 6 on support substrate 3 of wafer 7.

Herein, the removal of the ion-implantation-affected layer is preferably carried out by wet etching or dry etching. The wet etching may be carried out using at least one etching solution selected from, for example, KOH solution, $NH_4OH$ solution, NaOH solution, CsOH solution, SC-1 solution consisting of aqueous ammonia (28 wt %), aqueous hydrogen peroxide (30-35 wt %), and the balance of water, EDP (ethylenediamine pyrocatechol) solution, TMAH (tetramethylammonium hydroxide) solution, and hydrazine solution. Examples of dry etching include reactive gas etching of exposing the semiconductor layer 6 on support substrate 3 to fluorine-based gas, and reactive ion etching of creating a plasma of fluorine-based gas for ionization and etching the semiconductor layer 6 with the resulting radicals.

Also, the region to be removed in this step is the entire ion-implantation-affected layer of the semiconductor layer 6 which contains at least crystal defects, that is, a surface layer of the semiconductor layer 6 having a thickness of preferably at least 120 nm, more preferably at least 150 nm. The semiconductor layer 6 on support substrate 3 has a thickness of 100 to 400 nm.

Finally, the semiconductor layer 6 on support substrate 3 is mirror finished at its surface. Specifically, the semiconductor layer 6 is subjected to chemical-mechanical polishing (CMP) to mirror finish. Polishing may be any prior art well-known CMP used for the planarization of silicon wafers. Notably, the CMP may additionally achieve the removal of the ion-implantation-affected layer.

Past the aforementioned steps, there is obtained a composite substrate 8 including insulating film 4 and semiconductor layer 6 stacked on support substrate 3 (FIG. 1 (f)), which is suitable in electronic device application.

It is noted that the method of obtaining a semiconductor layer 6 by thinning a semiconductor substrate 1 is described by referring to the embodiment relying on the ion implantation/separation process although the invention is not limited thereto. For example, the semiconductor substrate 1 may be thinned by using any one of mechanical means such as grinding, lapping and polishing, and chemical means such as etching, or any combination thereof.

EXAMPLES

Examples and Comparative Examples are given below for illustrating the invention, but the invention is not limited thereto.

Example 1

A test sample was prepared and evaluated by the following procedure.

First, a film was formed by conversion from perhydropolysilazane to $SiO_2$ on a support substrate in the form of Si wafer. Specifically, 2 mL of a solution containing 20 wt % perhydropolysilazane in di-n-butyl ether solvent (Tresmile, Product No. ANN120-20 by Sanwa Kagaku Corp.) was spin coated onto a Si wafer with an outer diameter of 150 mm, and then heated at 150° C. for 3 minutes to remove the solvent. Then firing treatment was carried out by heating in air at 600° C. for 3 minutes, for converting the coating to a $SiO_2$ film. The film at the end of firing treatment had a thickness of 200 nm. A change in quality of the film before and after the firing treatment was confirmed by IR absorption spectroscopy, and the $SiO_2$ film surface after the firing treatment was measured for surface roughness (Rms) under an atomic force microscope (AFM). Further, the $SiO_2$ film was evaluated for dielectric strength at 10 points in the wafer surface by the time-zero dielectric breakdown (TZDB) method.

Next, the support substrate at the $SiO_2$ film-bearing surface was joined to a hydrogen-ion-implanted Si wafer at the ion-implanted surface and heat treated for bonding. Specifically, hydrogen ions were implanted into an Si wafer at 57 keV and in a dose of $6.0 \times 10^{16}$ atoms/$cm^2$. The ion-implanted surface of Si wafer and the $SiO_2$ film surface of support substrate were subjected to ion beam activation treatment. The substrates were joined together, and heat treatment was carried out at 300° C. for 10 hours for bonding. After the heat treatment at 300° C., the bonded substrate was observed under an ultrasonic microscope to inspect any delamination and voids at the bonding interface.

Next, the bonded substrate was subjected to separation along the ion-implanted region, thereby transferring a Si single crystal thin film to the support substrate. The substrate having Si single crystal thin film transferred was heat treated in a $N_2$ atmosphere at 1,000° C. before it was observed under an ultrasonic microscope to inspect any delamination and voids at the bonding interface.

Example 2

The same procedure as in Example 1 was repeated except that the firing temperature was changed to 800° C., thereby transferring a Si single crystal thin film to the support substrate. It was evaluated as in Example 1.

Example 3

The same procedure as in Example 1 was repeated except that the firing temperature was changed to 1,000° C., thereby transferring a Si single crystal thin film to the support substrate. It was evaluated as in Example 1.

Comparative Example 1

The same procedure as in Example 1 was repeated except that the firing temperature was changed to 450° C., thereby transferring a Si single crystal thin film to the support substrate. It was evaluated as in Example 1.

Comparative Example 2

The same procedure as in Example 1 was repeated except that the support substrate was a Si wafer on which a $SiO_2$ film of 200 nm thick was formed via thermal oxidation by heating at 1,000° C. in an oxygen-containing atmosphere, thereby transferring a Si single crystal thin film to the support substrate. It was evaluated as in Example 1.

<Change of IR Absorption Spectrum with Heat Treatment Temperature>

Figure 2:
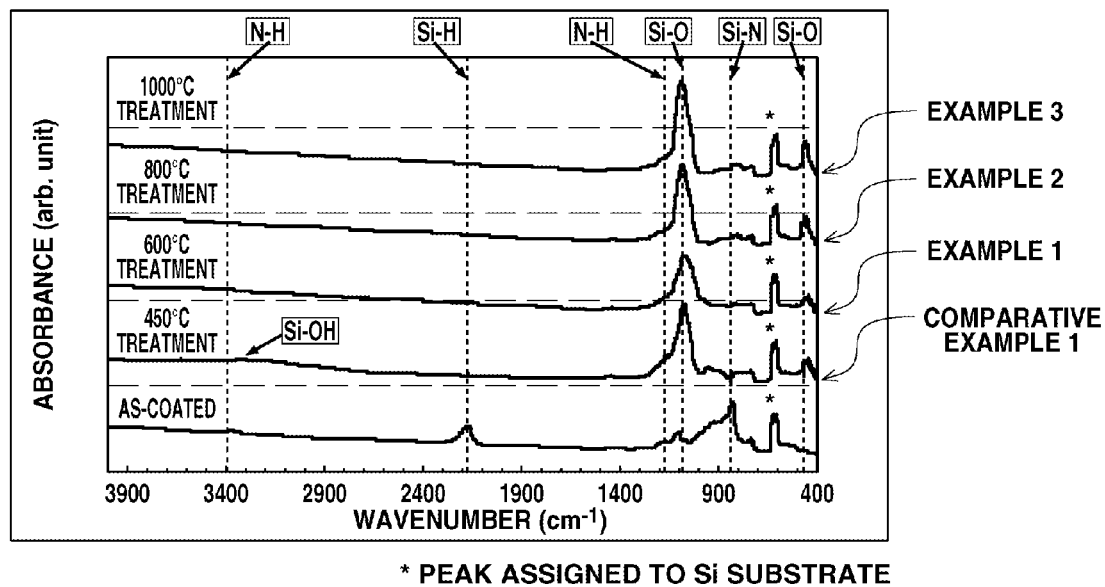
FIG. 2 is a diagram showing IR absorption spectra of $SiO_2$ films on support substrates in Examples 1 to 3 and Comparative Example 1.

FIG. 2 illustrates analysis results by IR absorption spectroscopy of $SiO_2$ films on support substrates in Examples 1 to 3 and Comparative Example 1. The IR absorption spectrum of perhydropolysilazane film (as-coated) after 150° C. drying and prior to firing treatment is also illustrated in FIG. 2. Notably, IR absorption spectroscopy was measured by a Fourier transform infrared spectrometer (Spectrum One by PerkinElmer Inc.) in the transmission mode.

As shown in FIG. 2, a comparison of Examples 1 to 3 and Comparative Example 1 with the as-coated film reveals that as a result of firing treatment at 450° C. or higher, absorption peaks assigned to Si—H, N—H and Si—N disappear, and a peak assigned to Si—O appears instead, proving conversion to $SiO_2$. In Comparative Example 1 at firing temperature 450° C., absorption peaks assigned to OH group are observed at a wave number of 3,000 to 3,800 $cm^{-1}$, indicating that the coating has undergone conversion to $SiO_2$, but silanol groups are still present. At a firing temperature of 600° C. or higher, no absorption peaks assigned to silanol group are observed, indicating the progress of condensation of silanol.

<Evaluation of Dielectric Strength>

Figure 3:
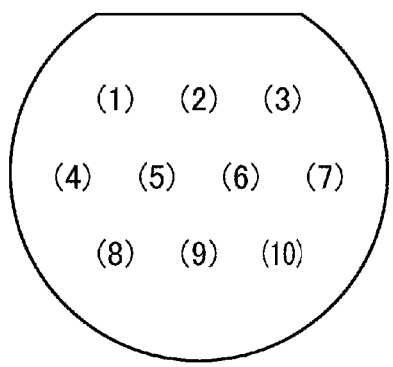
FIG. 3 is a plan view of a wafer, showing points for evaluation of dielectric strength.

Each of the SiO$_2$ films prepared in Example 1, Comparative Examples 1 and 2 was evaluated for dielectric strength on the wafer (depicted at 1 to 10 in FIG. 3) at ten points on the wafer by the time-zero dielectric breakdown (TZDB) method. In the measurement by the TZDB method, a leakage current was measured while setting a gate area of 8 mm$^2$ and applying voltage in steps of 1 V. The applied voltage divided by the thickness of the SiO$_2$ film is reported as field strength (MV/cm).

Figure 4:
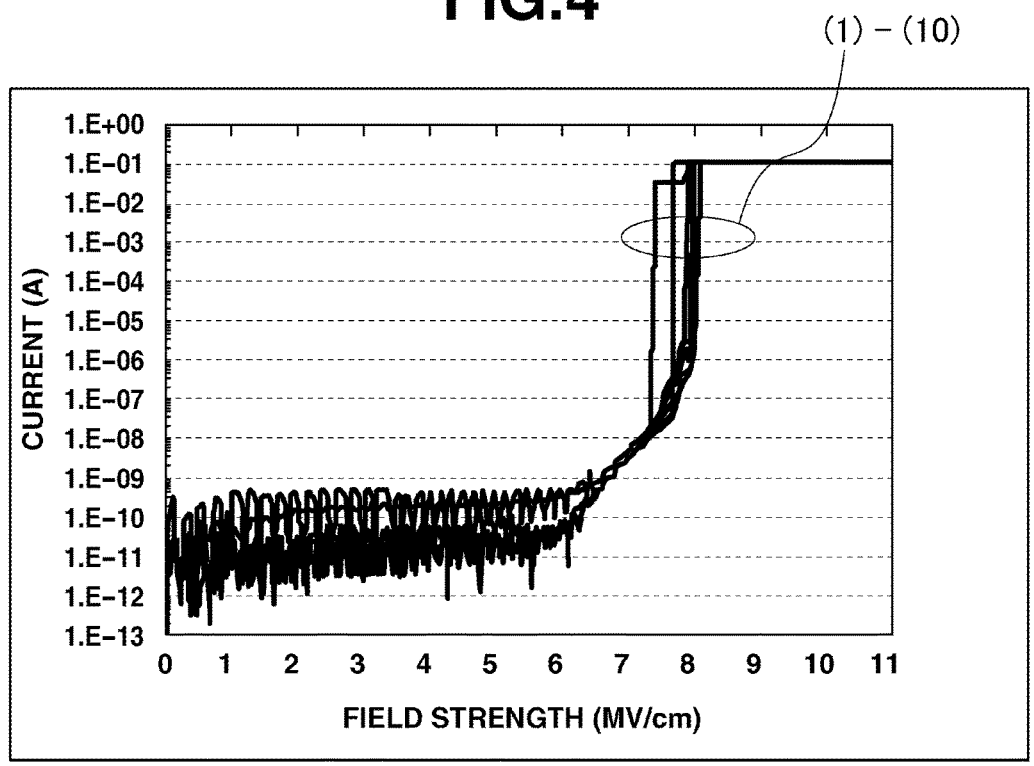
FIG. 4 is a diagram showing the evaluation results of dielectric strength of Example 1.
Figure 5:
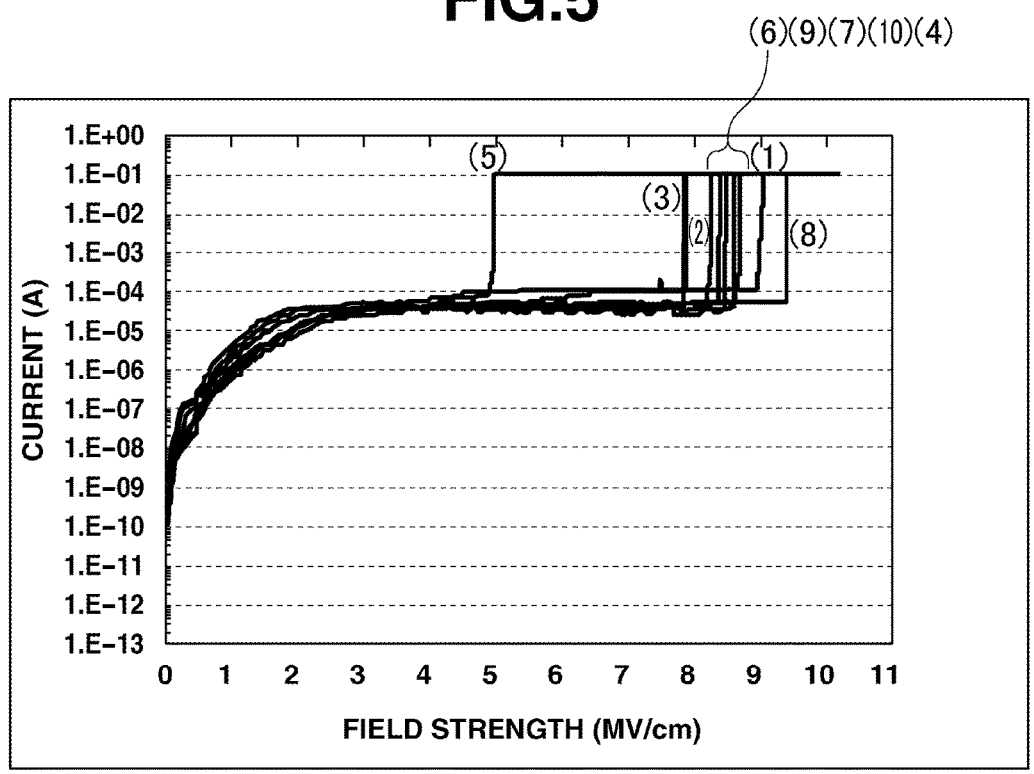
FIG. 5 is a diagram showing the evaluation results of dielectric strength of Comparative Example 1.
Figure 6:
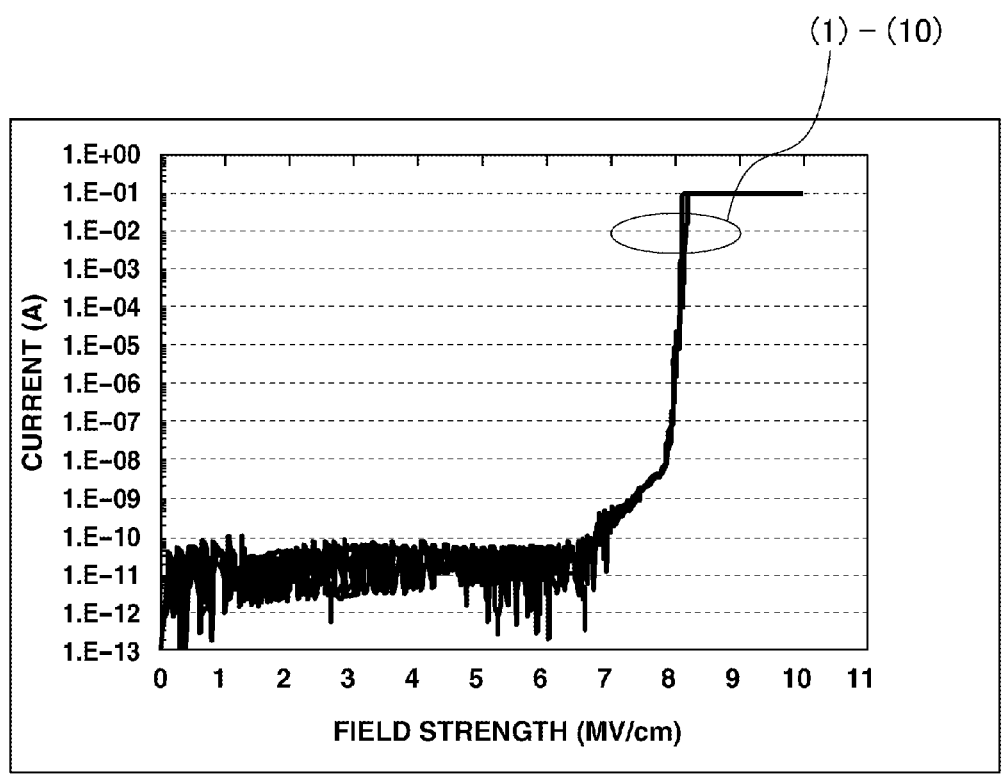
FIG. 6 is a diagram showing the evaluation results of dielectric strength of Comparative Example 2.

The results are shown in FIGS. 4 to 6. FIG. 4 shows the evaluation results of Example 1 (SiO$_2$ film after firing treatment at 600° C.), FIG. 5 shows the evaluation results of Comparative Example 1 (SiO$_2$ film after firing treatment at 450° C.), and FIG. 6 shows the evaluation results of Comparative Example 2 (thermally oxidized film). The numerals in FIGS. 4 to 6 correspond to the points of evaluation in FIG. 3.

As shown in FIG. 4, the SiO$_2$ film of Example 1 wherein silanol groups have been condensed at the firing temperature of 600° C. has similar I-V characteristics to the thermally oxidized film of Comparative Example 2 (FIG. 6). It is presumed that firing treatment at 600° C. or higher causes silanol groups in the film to be condensed, leading to low leakage current. By contrast, the SiO$_2$ film of Comparative Example 1, which has been fired at 450° C. and contains residual silanol groups, shows a dielectric breakdown field strength equivalent to Example 1 (FIG. 4) and Comparative Example 2 (FIG. 6), but higher leakage current values.

It has been demonstrated that firing treatment of a perhydropolysilazane-containing coating at 600° C. or higher causes silanol groups therein to be condensed to form a SiO$_2$ film of equivalent quality to the thermally oxidized film.

<Evaluation of Bond and Inspection of Delamination and Voids after Heat Treatment>

For Examples 1 to 3 and Comparative Examples 1 and 2, the measurement results of surface roughness of the SiO$_2$ film and the results of examination of the bondability between support substrate and Si wafer are tabulated in Table 1.

The SiO$_2$ films resulting from perhydropolysilazane in Examples 1 to 3 and Comparative Example 1 have a slightly greater surface roughness Rms than the surface roughness Rms of the thermally oxidized film in Comparative Example 2. To examine whether or not the SiO$_2$ film on the support substrate could be bonded to a Si wafer without surface polishing, its bondability was examined using a hydrogen ion-implanted Si wafer. Specifically, the bonded wafer was observed under an ultrasonic microscope, and the bonded state was judged good or poor by inspecting any bubbles at the bonding interface. As a result, all of Examples 1 to 3 and Comparative Example 1 prove the possibility of bonding.

Also, the bonded substrate after the heat treatment by heating at 300° C. for bonding and prior to the separation treatment was observed under an ultrasonic microscope to see any delamination and voids at the bonding interface. As a result, the SiO$_2$ film of Comparative Example 1 at firing temperature 450° C. was observed to generate many voids at the bonding interface. In Examples 1 to 3, neither delamination nor voids were observed at the bonding interface. It is presumed that in Comparative Example 1, condensation of silanol groups in the SiO$_2$ film generates a gas or moisture in the film is gasified by the heat treatment for bonding whereupon the gas diffuses to the bonding interface to generate voids.

Next, the bonded substrate was separated along the ion-implanted region to transfer a Si film, and the resulting substrate was heat treated at 1,000° C. before it was observed to inspect any new delamination and voids at the bonding interface. The films of SiO$_2$ conversion at 600° C. or higher (Examples 1 to 3) and the thermally oxidized film (Comparative Example 2) showed no changes.

TABLE 1

| | Firing | | | Delamination and voids | |
| --- | --- | --- | --- | --- | --- |
| | treatment temperature (° C.) | Surface roughness Rms (nm) | Bondability | After 300° C. heating | After 1000° C. heating |
| Example 1 | 600 | 0.54 | OK | nil | nil |
| Example 2 | 800 | 0.41 | OK | nil | nil |
| Example 3 | 1000 | 0.38 | OK | nil | nil |
| Comparative Example 1 | 450 | 0.67 | OK | found | — |
| Comparative Example 2 | — | 0.24 | OK | nil | nil |

Example 4

It was examined whether or not a substrate having a rough surface could be bonded to a Si wafer after polysilazane was coated to the substrate and converted to SiO$_2$. The substrate used was a GaN wafer having a diameter of 2 inches. Its surface roughness Rms was measured under AFM to be 2.14 nm. The substrate as such could not be bonded to an ion-implanted Si wafer having an outer diameter of 2 inches.

On the surface of the GaN wafer, 1 mL of a solution containing 5 wt % perhydropolysilazane in di-n-butyl ether was spin coated, and then heated at 150° C. for 3 minutes to remove the solvent. Then heat treatment was carried out in air at 600° C. for 3 minutes for converting the coating to a SiO$_2$ film. After the firing treatment, the film had a thickness of 50 nm and a surface roughness Rms of 0.39 nm as measured by AFM, indicating that the surface roughness was reduced to a level amenable to bonding. On examination whether or not this substrate could be bonded to an ion-implanted Si wafer, bonding was possible without any voids at the interface.

Comparative Example 3

An improvement in surface roughness of a GaN wafer was examined by depositing SiO$_2$ thereon by PECVD instead of spin coating of perhydropolysilazane. The SiO$_2$ film was set to a thickness of 50 nm. The surface roughness Rms of the film as deposited was measured by AFM to be 1.38 nm, which was greater than the SiO$_2$ film converted from polysilazane. An attempt to bond the wafer with this surface roughness to a Si wafer failed. It was confirmed that a further polishing step after SiO$_2$ deposition was necessary to enable bonding.

It has been demonstrated that a film obtained by coating perhydropolysilazane and heating at a temperature of at least 600° C. for conversion to SiO$_2$ enables bonding without polishing after conversion, that is, at the thickness as of firing treatment. Firing treatment at 600° C. or higher ensures that the film is devoid of any delamination or voids at the bonding interface upon heat treatment after bonding, and the film is stable during treatment at about 1,000° C. which is near the highest temperature of the device manufacture process. Firing treatment at 600° C. or higher also ensures that the SiO$_2$ film has a dielectric strength and a leakage current value under applied voltage which are substantially equivalent to those of the thermally oxidized film so that it may be fully useful as a joint layer immediately beneath a single crystal semiconductor thin film where a device is to be formed.

Although the illustrated embodiment refers to a Si substrate serving as the support substrate which is coated and bonded to an ion-implanted Si substrate, a SiC or GaN single crystal wafer having a higher surface roughness Rms than the Si wafer by one order of magnitude may be bonded without delamination or void formation as long as perhydroxypolysilazane is coated thereon and converted to a $SiO_2$ insulating film via firing treatment at 600° C. or higher so that the surface roughness is reduced. In this case, a film can be formed by simple means such as spin coating, unlike the film deposition by CVD method, and the substrate can be bonded without polishing. Further, since the temperature for conversion to $SiO_2$ film is the firing temperature at which no silanol groups are left, a joint layer having satisfactory insulating properties is obtainable.

Although the invention has been described with reference to the illustrated embodiments, the invention is not limited thereto, and other embodiments may occur to, or various additions, changes and deletions may be made by those skilled in the art. All such embodiments fall in the scope of the invention as long as the advantages and results of the invention are obtainable.

REFERENCE SIGNS LIST 1 semiconductor substrate
2 ion-implanted region
3 support substrate
4 insulating film (silicon oxide film)
4a coating
5 bonded substrate (joined assembly)
6 semiconductor layer
7 wafer
8 composite substrate

The invention claimed is:

1. A method for preparing a composite substrate, comprising the steps of:
    coating a polysilazane-containing coating composition on the surface of a support substrate of SiC or GaN to be bonded, to form a polysilazane-containing coating;
    subjecting the coating to firing treatment of heating at 600° C. to 1,200° C. to form a silicon-containing insulating film, wherein the insulating film as of firing treatment has a thickness of 10 to 200 nm and a surface roughness Rms of up to 1.0 nm, and thereafter;
    bonding a semiconductor substrate to the support substrate via the insulating film, while keeping the thickness of the insulating film as of the firing treatment; and
    thinning the semiconductor substrate for thereby yielding the composite substrate having a semiconductor layer on the support substrate.

2. The method for preparing a composite substrate of claim 1 wherein the polysilazane is a perhydropolysilazane.

3. The method for preparing a composite substrate of claim 1 wherein the firing treatment is carried out in an atmosphere containing oxygen and/or steam.

4. The method for preparing a composite substrate of claim 1, wherein the firing treatment is carried out in an inert atmosphere containing nitrogen or under reduced pressure to convert polysilazane in the coating to SiN.

5. The method for preparing a composite substrate of claim 1, the method comprising the steps of:
    implanting ions into the surface of the semiconductor substrate to form an ion-implanted region; and
    separating the semiconductor substrate at the ion-implanted region, thus leaving a semiconductor layer on the support substrate.

6. A composite substrate obtained by the method of claim 1.

7. The method for preparing a composite substrate of claim 1, wherein the semiconductor substrate is composed of a material selected from the group consisting of Si, SiGe, SiC, AlN, Ge, GaN, ZnO, and GaAs.

8. The method for preparing a composite substrate of claim 1, wherein the semiconductor substrate is a single crystal silicon substrate.

9. The method for preparing a composite substrate of claim 1, wherein the insulating film has a sufficiently smooth surface to enable bonding at the thickness as of firing treatment without a need for polishing the surface of the insulating film.

* * * * *